United States Patent
Zhou et al.

(10) Patent No.: US 12,327,974 B2
(45) Date of Patent: Jun. 10, 2025

(54) SINGLE EMITTER STACKING FOR WAVELENGTH-BEAM-COMBINING LASER SYSTEMS

(71) Applicant: WBC Photonics, Inc., Wilmington, MA (US)

(72) Inventors: Wang-Long Zhou, Revere, MA (US); Michael Deutsch, Derry, NH (US); Francisco Villarreal-Saucedo, Middleton, MA (US); Bien Chann, Merrimack, NH (US)

(73) Assignee: WBC Photonics, Inc., Derry, NH (US)

( * ) Notice: Subject to any disclaimer, the term of this patent is extended or adjusted under 35 U.S.C. 154(b) by 361 days.

(21) Appl. No.: 17/864,527

(22) Filed: Jul. 14, 2022

(65) Prior Publication Data

US 2023/0012623 A1    Jan. 19, 2023

Related U.S. Application Data

(60) Provisional application No. 63/222,613, filed on Jul. 16, 2021.

(51) Int. Cl.
*H01S 3/00* (2006.01)
*H01S 3/13* (2006.01)
*H01S 5/026* (2006.01)

(52) U.S. Cl.
CPC .......... *H01S 3/0071* (2013.01); *H01S 3/1304* (2013.01); *H01S 5/0264* (2013.01)

(58) Field of Classification Search
None
See application file for complete search history.

(56) References Cited

U.S. PATENT DOCUMENTS

| | | | | |
|---|---|---|---|---|
| 5,048,911 A | * | 9/1991 | Sang | A61N 5/062 385/33 |
| 6,240,116 B1 | * | 5/2001 | Lang | G02B 27/0977 372/50.23 |
| 11,224,937 B2 | * | 1/2022 | Kishimoto | H01S 5/0225 |
| 2006/0018356 A1 | * | 1/2006 | Voss | H01S 5/405 372/50.12 |
| 2010/0103544 A1 | * | 4/2010 | Vethake | G02B 27/0905 359/850 |
| 2010/0103973 A1 | * | 4/2010 | Bonna | H01S 5/4056 372/50.23 |

(Continued)

FOREIGN PATENT DOCUMENTS

| | | | | |
|---|---|---|---|---|
| CN | 112782912 A | * | 5/2021 | G03B 21/142 |
| JP | 2003103389 A | * | 4/2003 | |

OTHER PUBLICATIONS

English machine translation for CN-112782912-A (Year: 2021).*

(Continued)

*Primary Examiner* — David E Smith
*Assistant Examiner* — Alina Kaliszewski
(74) *Attorney, Agent, or Firm* — Danielson Legal LLC

(57) ABSTRACT

In various embodiments, multiple laser emitters are arranged in one or more linear stacks and emit beams to one or more linear stacks of interleaving mirrors. The interleaving mirrors direct the beams to a shared exit point, thereby forming an output beam stack. The optical distances traversed by each beam from its emitter to the shared exit point are all equal to each other.

19 Claims, 10 Drawing Sheets

(56) References Cited

U.S. PATENT DOCUMENTS

| | | | | |
|---|---|---|---|---|
| 2012/0002293 A1* | 1/2012 | Du | .................. | H01S 5/02326 |
| | | | | 359/629 |
| 2013/0194801 A1* | 8/2013 | Wolf | .................. | H01S 5/4025 |
| | | | | 362/241 |
| 2015/0229099 A1 | 8/2015 | Tayebati et al. | | |
| 2016/0097843 A1* | 4/2016 | Nakamura | ......... | G02B 27/0927 |
| | | | | 250/221 |
| 2018/0198257 A1 | 7/2018 | Chann et al. | | |
| 2019/0212497 A1* | 7/2019 | Hemenway | .......... | G02B 27/123 |
| 2020/0119525 A1* | 4/2020 | Zhou | .................. | H01S 5/4012 |
| 2020/0379088 A1* | 12/2020 | Donovan | ............. | G01S 7/4817 |

OTHER PUBLICATIONS

English machine translation for JP-2003103389-A (Year: 2003).*
International Search Report and Written Opinion, PCT Application No. PCT/US2022/037075, dated Nov. 7, 2022, 10 pages.

* cited by examiner

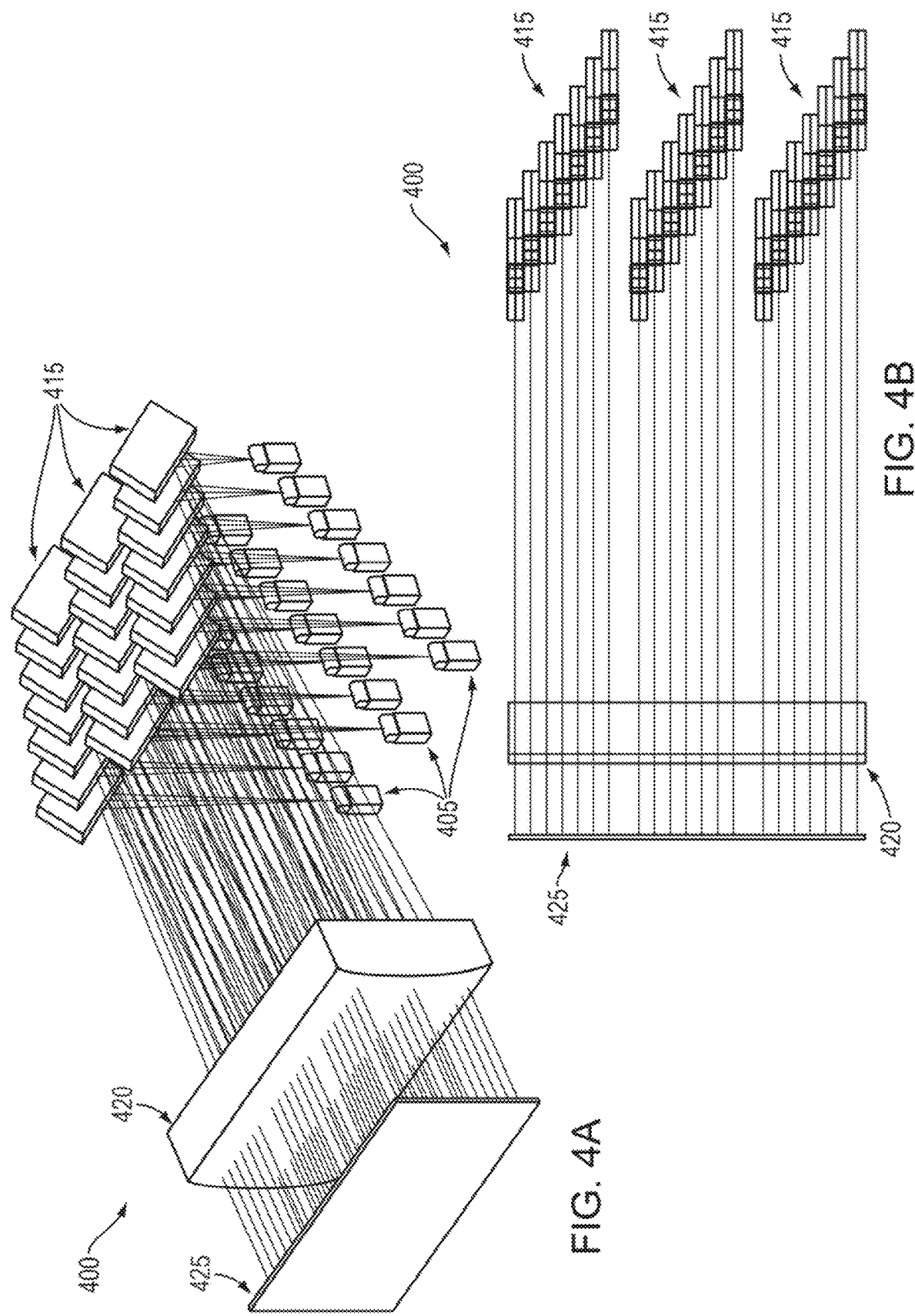

SINGLE EMITTER STACKING FOR WAVELENGTH-BEAM-COMBINING LASER SYSTEMS

RELATED APPLICATIONS

This application claims the benefit of U.S. Provisional Patent Application No. 63/222,613, filed Jul. 16, 2021, the entire disclosure of which is hereby incorporated by reference.

TECHNICAL FIELD

In various embodiments, the present invention relates to laser systems, specifically laser systems featuring stacked single beam emitters.

BACKGROUND

High-power laser systems are utilized for a host of different applications, such as welding, cutting, drilling, and materials processing. Such laser systems typically include a laser emitter, the laser light from which is coupled into an optical fiber (or simply a "fiber"), and an optical system that focuses the laser light from the fiber onto the workpiece to be processed. Optical systems for laser systems are typically engineered to produce the highest-quality laser beam, or, equivalently, the beam with the lowest beam parameter product (BPP). The BPP is the product of the laser beam's divergence angle (half-angle) and the radius of the beam at its narrowest point (i.e., the beam waist, the minimum spot size). That is, BPP=NA×D/2, where D is the focusing spot (the waist) diameter and NA is the numerical aperture; thus, the BPP may be varied by varying NA and/or D. The BPP quantifies the quality of the laser beam and how well it can be focused to a small spot, and is typically expressed in units of millimeter-milliradians (mm-mrad). A Gaussian beam has the lowest possible BPP, given by the wavelength of the laser light divided by pi. The ratio of the BPP of an actual beam to that of an ideal Gaussian beam at the same wavelength is denoted $M^2$, which is a wavelength-independent measure of beam quality.

Wavelength beam combining (WBC) is a technique for scaling the output power and brightness from laser diodes, laser diode bars, stacks of diode bars, or other lasers arranged in a one- or two-dimensional array. WBC methods have been developed to combine beams along one or both dimensions of an array of emitters. Typical WBC systems include a plurality of emitters, such as one or more diode bars, that are combined using a dispersive element to form a multi-wavelength beam. Each emitter in the WBC system individually resonates, and is stabilized through wavelength-specific feedback from a common partially reflecting output coupler that is filtered by the dispersive element along a beam-combining dimension. Exemplary WBC systems are detailed in U.S. Pat. No. 6,192,062, filed on Feb. 4, 2000, U.S. Pat. No. 6,208,679, filed on Sep. 8, 1998, U.S. Pat. No. 8,670,180, filed on Aug. 25, 2011, and U.S. Pat. No. 8,559,107, filed on Mar. 7, 2011, the entire disclosure of each of which is incorporated by reference herein.

In order to maximize output power, many WBC systems combine beams emitted by multiple-beam emitters, such as diode bars. (As used herein, a "multiple-beam emitter" includes multiple beam sources, each emitting a beam, within a single package. A diode bar, in which each beam source is a semiconductor diode, is one example.) That is, in such systems multiple beams emitted by each of multiple diode bars are combined into a single output beam. Diode bars conveniently provide multiple, closely spaced, emitters (e.g., 19-49, or even more) within a single package. However, various issues may arise related to the use of diode bars in WBC systems.

In a diode bar, individual diode emitters are situated side-by-side in the slow-axis direction of the emitted beams. However, when such beams are combined into a single beam in WBC systems, it is generally preferred to do so in the fast-axis dimension for enhanced beam quality (for example, beam combining in the slow-axis dimension may result in pointing or alignment errors that may compromise the quality of the combined beam). Thus, in WBC systems, diode bars are often utilized with beam rotators (or "optical twisters") that rotate the beams by 90° to thereby facilitate beam combining in the fast-axis dimension. However, optical beam rotators constitute additional expense in WBC systems, and their use may even result in power loss and optical aberrations that compromise beam quality.

In addition, many WBC systems collimate the beams from each diode bar utilizing individual fast-axis collimation (FAC) lenses and slow-axis collimation (SAC) lenses for each diode bar. This also results in additional system-level costs and can also require a large amount of space to accommodate the multiple different SAC lenses positioned optically downstream of the diode bars.

Moreover, multiple-beam emitters such as diode bars often suffer from "smile," i.e., misalignment or curvature in the horizontal, slow-axis dimension. Even if smile is not inherently present in a bare diode bar, it may be induced in the diode bar when installed in the laser system, due to, for example, unbalanced stresses induced by physical (e.g., mounting) and/or thermal effects. Diode bars also typically require high operating currents to drive the multiple diode emitters, and can suffer from emitter-to-emitter thermal crosstalk within the bar, rendering cooling schemes more complicated and difficult.

In view of the above, there is a need for improved WBC laser sources and systems that address issues arising from the use of diode bars while still enabling the formation of high-quality output beams resulting from the combination of many input beams.

SUMMARY

Various embodiments of the present invention provide laser beam sources for WBC systems based on arrangements of single emitters, i.e., individual packages each containing only a single beam source, such as semiconductor diode emitters. In various embodiments, the emitters are arranged such that their beams are stacked (e.g., in the fast-axis dimension) into an aligned beam stack, and such beam stacks may be conveniently utilized as inputs in WBC laser systems. As utilized herein, "stacked" beams propagate in the same direction and may be, but need not be, overlapping (i.e., stacked beams may be partially or completely overlapped, but need not be). While stacked beams are aligned with each other in at least one dimension (e.g., as viewed in plan or top view), in a perpendicular dimension (e.g., as viewed from the side) the beams may not fully overlap and may even be spatially separated from each other.

In various embodiments, the emitters are arranged such that they share a single SAC lens, and also such that the optical path lengths between each emitter and the SAC lens are substantially identical (e.g., identical to within ±10% of each other, or even identical to within ±5% of each other). In this manner, embodiments of the invention not only reduce overall system costs and increase system compactness (e.g., due to the use of a single SAC lens instead of dedicated SAC lenses for each emitter) and provide excellent beam quality due to the equal path lengths of the beams.

In various embodiments, the beams from the beam emitters (e.g., diode emitters) are stacked in the fast axis, obviating the need for beam twisters and the costs and beam-quality and power degradation concomitant therewith. Moreover, the use of single emitters enables the use of dramatically reduced operating currents, because single emitters may be conveniently electrically connected in series (a diode bar is effectively multiple diode sources connected in parallel in a single package). Single emitters also do not suffer from emitter smile, resulting in higher-quality WBC output. The use of single emitters also minimizes the amount of thermal crosstalk between emitters, which helps simplify cooling design for the source emitters. Finally, single emitters such as diode emitters also have much longer lifetimes when compared to diode bars, which results in greater system operating time and less maintenance downtime and cost.

In various embodiments of the invention, multiple source emitters are arranged in one or more linear stacks, or arrangements (i.e., substantially straight lines of emitters). In each linear stack, the emitters may be spaced apart from each other in each of three mutually perpendicular dimensions, and these spacings may be substantially consistent along each (or even all) of the linear stacks. The beams are emitted to a series of interleaving mirrors that intercept the beams and reflect them to a shared exit point such that the beams are stacked along one dimension at the exit point (i.e., thereby forming a "beam stack"). Importantly, the interleaving mirrors are arranged such that the optical distances traversed by each beam from its emitted point to the shared exit point are approximately equal to each other. For example, the interleaving mirrors may also be arranged in one or more linear stacks. Various embodiments of the invention feature a single shared collimating lens (e.g., a SAC lens) at the exit point for the beams, in order to collimate the stacked beams (e.g., in the slow axis).

In embodiments featuring multiple linear arrangements of emitters, the emitters may be arranged in a series of lines that are parallel to each other. In other embodiments, the linear arrangements may be arranged as pairwise mirror images. That is, each pair of lines of emitters will be mirror images of each other (and thus typically not parallel to each other). In such embodiments, all of the linear arrangements of emitters in a particular system may have the same number of emitters, or two or more of them may feature different numbers of emitters. (For example, two lines of emitters that are mirror images may be symmetrically oriented across a mirror plane but still have different numbers of emitters in them.)

In typical embodiments of the invention, emitters are arranged in one or more linear arrangements, rather than helically arranged and emitting toward a shared central point, as described in U.S. Ser. No. 17/514,130, filed Oct. 29, 2021, the entire disclosure of which is incorporated by reference herein.

In various embodiments, the stacked output beams from multiple such source modules may be combined into a single output beam in a WBC system, via a dispersive element and a partially reflective output coupler. Such output beams (which may be multi-wavelength beams) may be coupled into optical fibers and/or utilized for processing of a variety of different workpieces. For example, embodiments of the present invention may couple one or more laser beams into an optical fiber. In various embodiments, the optical fiber has multiple cladding layers surrounding a single core, multiple discrete core regions (or "cores") within a single cladding layer, or multiple cores surrounded by multiple cladding layers.

Herein, "optical elements" may refer to any of lenses, mirrors, prisms, gratings, and the like, which redirect, reflect, bend, or in any other manner optically manipulate electromagnetic radiation, unless otherwise indicated.

Although diffraction gratings are utilized herein as exemplary dispersive elements, embodiments of the invention may utilize other dispersive elements such as, for example, dispersive prisms, transmission gratings, or Echelle gratings. Embodiments of the invention may utilize one or more prisms in addition to one or more diffraction gratings, for example as described in U.S. patent application Ser. No. 15/410,277, filed on Jan. 19, 2017, the entire disclosure of which is incorporated by reference herein.

Output beams produced in accordance with embodiments of the present invention may be utilized to process a workpiece such that the surface of the workpiece is physically altered and/or such that a feature is formed on or within the surface, in contrast with optical techniques that merely probe a surface with light (e.g., reflectivity measurements). Exemplary processes in accordance with embodiments of the invention include cutting, welding, drilling, and soldering. Various embodiments of the invention also process workpieces at one or more spots or along a one-dimensional processing path, rather than simultaneously flooding all or substantially all of the workpiece surface with radiation from the laser beam. In general, processing paths may be curvilinear or linear, and "linear" processing paths may feature one or more directional changes, i.e., linear processing paths may be composed of two or more substantially straight segments that are not necessarily parallel to each other.

Embodiments of the invention may vary beam shape and/or BPP to improve or optimize performance for different types of processing techniques or different types of materials being processed. Embodiments of the invention may utilize various techniques for varying BPP and/or shape of laser beams described in U.S. patent application Ser. No. 14/632,283, filed on Feb. 26, 2015, U.S. patent application Ser. No. 14/747,073, filed Jun. 23, 2015, U.S. patent application Ser. No. 14/852,939, filed Sep. 14, 2015, U.S. patent application Ser. No. 15/188,076, filed Jun. 21, 2016, U.S. patent application Ser. No. 15/479,745, filed Apr. 5, 2017, and U.S. patent application Ser. No. 15/649,841, filed Jul. 14, 2017, the disclosure of each of which is incorporated in its entirety herein by reference.

Laser systems in accordance with various embodiments of the present invention may also include a delivery mechanism that directs the laser output onto the workpiece while causing relative movement between the output and the workpiece. For example, the delivery mechanism may include, consist essentially of, or consist of a laser head for directing and/or focusing the output toward the workpiece. The laser head may itself be movable and/or rotatable relative to the workpiece, and/or the delivery mechanism may include a movable gantry or other platform for the workpiece to enable movement of the workpiece relative to the output, which may be fixed in place.

In various embodiments of the present invention, the laser beams utilized for processing of various workpieces may be delivered to the workpiece via one or more optical fibers (or "delivery fibers"). Embodiments of the invention may incorporate optical fibers having many different internal configurations and geometries. Such optical fibers may have one or more core regions and one or more cladding regions. For example, the optical fiber may include, consist essentially of, or consist of a central core region and an annular core region separated by an inner cladding layer. One or more outer cladding layers may be disposed around the annular core region. Embodiments of the invention may be utilized with and/or incorporate optical fibers having configurations described in U.S. patent application Ser. No. 15/479,745, filed on Apr. 5, 2017, U.S. patent application Ser. No. 15/879,500, filed on Jan. 25, 2018, and U.S. patent application Ser. No. 16/675,655, filed on Nov. 6, 2019, the entire disclosure of each of which is incorporated by reference herein.

Structurally, optical fibers in accordance with embodiments of the invention may include one or more layers of high and/or low refractive index beyond (i.e., outside of) an exterior cladding without altering the principles of the present invention. Various ones of these additional layers may also be termed claddings or coatings, and may not guide light. Optical fibers may also include one or more cores in addition to those specifically mentioned. Such variants are within the scope of the present invention. Various embodiments of the invention do not incorporate mode strippers in or on the optical fiber structure. Similarly, the various layers of optical fibers in accordance with embodiments of the invention are continuous along the entire length of the fiber and do not contain holes, photonic-crystal structures, breaks, gaps, or other discontinuities therein.

Optical fibers in accordance with the invention may be multi-mode fibers and therefore support multiple modes therein (e.g., more than three, more than ten, more than 20, more than 50, or more than 100 modes). In addition, optical fibers in accordance with the invention are generally passive fibers, i.e., are not doped with active dopants (e.g., erbium, ytterbium, thulium, neodymium, dysprosium, praseodymium, holmium, or other rare-earth metals) as are typically utilized for pumped fiber lasers and amplifiers. Rather, dopants utilized to select desired refractive indices in various layers of fibers in accordance with the present invention are generally passive dopants that are not excited by laser light, e.g., fluorine, titanium, germanium, and/or boron. Thus, optical fibers, and the various core and cladding layers thereof in accordance with various embodiments of the invention may include, consist essentially of, or consist of glass, such as substantially pure fused silica and/or fused silica, and may be doped with fluorine, titanium, germanium, and/or boron. Obtaining a desired refractive index for a particular layer or region of an optical fiber in accordance with embodiments of the invention may be accomplished (by techniques such as doping) by one of skill in the art without undue experimentation. Relatedly, optical fibers in accordance with embodiments of the invention may not incorporate reflectors or partial reflectors (e.g., grating such as Bragg gratings) therein or thereon. Fibers in accordance with embodiments of the invention are typically not pumped with pump light configured to generate laser light of a different wavelength. Rather, fibers in accordance with embodiments of the invention merely propagate light along their lengths without changing its wavelength. Optical fibers utilized in various embodiments of the invention may feature an optional external polymeric protective coating or sheath disposed around the more fragile glass or fused silica fiber itself.

In addition, systems and techniques in accordance with embodiments of the present invention are typically utilized for materials processing (e.g., cutting, drilling, etc.), rather than for applications such as optical communication or optical data transmission. Thus, laser beams, which may be coupled into fibers in accordance with embodiments of the invention, may have wavelengths different from the 1.3 µm or 1.5 µm utilized for optical communication. In fact, fibers utilized in accordance with embodiments of the present invention may exhibit dispersion at one or more (or even all) wavelengths in the range of approximately 1260 nm to approximately 1675 nm utilized for optical communication.

In an aspect, embodiments of the invention feature a laser apparatus in a three-dimensional space having x, y, and z mutually perpendicular axes defining x-y, x-z, and y-z planes. The laser apparatus includes, consists essentially of, or consists of a plurality of beam emitters arranged in one or more first linear stacks and a plurality of interleaving mirrors arranged in one or more second linear stacks. In each first linear stack the beam emitters are separated from each other (i) along the x axis by a (non-zero) distance $\Delta x$, (ii) along the y axis by a (non-zero) distance $\Delta y$, and (iii) along the z axis by a (non-zero) distance $\Delta z$. The number of the one or more second linear stacks is equal to the number of the one or more first linear stacks. Each interleaving mirror is positioned to receive a beam emitted by a different one of the beam emitters and direct the beam to a shared exit point, whereby a beam stack is output at the shared exit point. The optical distances traversed by each beam from its emitter to the shared exit point may be all equal to each other.

Embodiments of the invention may include one or more of the following in any of a variety of combinations. Each beam emitter may be configured to emit only a single beam. In each second linear stack the interleaving mirrors may be separated from each other (i) along the x axis by the distance $\Delta x$, and/or (ii) along the y axis by the distance $\Delta y$. A collimation lens may be disposed at the shared exit point. The collimation lens may be a slow-axis collimation lens configured to receive, and collimate in a slow axis, the beam stack. Each beam emitter may include, consist essentially of, or consist of a diode emitter. The apparatus may include a plurality of fast-axis collimation (FAC) lenses. Each FAC lens may be positioned to receive the beam from a different emitter and collimate the beam in the fast axis. The one or more first linear stacks may consist of a single first linear stack. The one or more first linear stacks may include, consist essentially of, or consist of a plurality of first linear stacks. Two or more of, or even all of, the plurality of first linear stacks may be arranged parallel to each other. The plurality of first linear stacks may be arranged as pairwise mirror images.

In the laser apparatus, $\Delta z$ may be approximately equal to $\Delta x$. Each beam emitter may be disposed on a different sub-mount. The distance $\Delta x$ may be greater than or approximately equal to a width of a single sub-mount. The distance $\Delta z$ may be greater than or approximately equal to the width of a single sub-mount. In the beam stack, the beams emitted by the beam emitters may be stacked along a fast axis of the beams. Each beam emitter may be oriented parallel to the x-z plane and configured to emit a beam along the z axis. A first projection angle of each first linear stack in the y-z plane may be approximately equal to $\arctan(\Delta y/\Delta z)$. A second projection angle of each first linear stack in the x-y plane may be approximately equal to $\arctan(\Delta y/\Delta x)$. A third projection angle of each first linear stack in the x-z plane may be approximately equal to $45°$. A beam size of the beam stack in a stacking direction may be approximately equal to $\Delta y \times N + b$, N being equal to a number of the beam emitters and b being equal to a size of each beam in the stacking direction. The stacking direction may be along a fast axis of the beams. Each second linear stack may be a monolithic component including, consisting essentially of, or consisting of a plurality of mirror surfaces. Each second linear stack may include, consists essentially of, or consist of a plurality of interleaving mirrors affixed to a common platform.

In another aspect, embodiments of the invention feature a method of beam stacking in a three-dimensional space having x, y, and z mutually perpendicular axes and defining x-y, x-z, and y-z planes. A plurality of beam emitters arranged in one or more first linear stacks is provided. In each first linear stack the beam emitters are separated from each other (i) along the x axis by a (non-zero) distance $\Delta x$, (ii) along the y axis by a (non-zero) distance $\Delta y$, and (iii) along the z axis by a (non-zero) distance $\Delta z$. The beam emitters are caused to each emit a beam toward a plurality of interleaving mirrors arranged in one or more second linear stacks. The beams are received with the interleaving mirrors and the beams are directed to a shared exit point, the beams being stacked in one dimension at the shared exit point, to thereby form a beam stack. The optical distances traversed by each beam from its emitter to the shared exit point may all be equal to each other.

Embodiments of the invention may include one or more of the following in any of a variety of combinations. The number of the first linear stacks may be equal to the number of the second linear stacks. The number of beam emitters may be equal to the number of interleaving mirrors. Each beam emitter may be configured to emit only a single beam. Each interleaving mirror may be positioned to receive one of the beams. Each of the beam emitters may include, consist essentially of, or consist of a diode emitter. Each of the beams may be collimated in a fast axis downstream of its beam emitter and upstream of the interleaving mirrors. Each of the beams may be collimated in a slow axis. Each of the beams may be collimated in a slow axis at the shared exit point. At least a portion of the beam stack may be coupled into an optical fiber. A workpiece may be processed with at least a portion of the beam stack. Processing the workpiece may include, consist essentially of, or consist of cutting, welding, etching, annealing, drilling, soldering, and/or brazing. Processing the workpiece may include, consist essentially of, or consist of physically altering at least a portion of a surface of the workpiece.

The beam stack may be wavelength-beam combined with one or more additional beam stacks to thereby form a wavelength-beam-combining (WBC) output beam. The beam stack and the one or more additional beam stacks may each include, consist essentially of, or consist of the same number of stacked beams. A workpiece may be processed with the WBC output beam. Processing the workpiece may include, consist essentially of, or consist of cutting, welding, etching, annealing, drilling, soldering, and/or brazing. Processing the workpiece may include, consist essentially of, or consist of physically altering at least a portion of a surface of the workpiece.

In each second linear stack the interleaving mirrors may be separated from each other (i) along the x axis by the distance $\Delta x$, and (ii) along the y axis by the distance $\Delta y$. The distance $\Delta z$ may be approximately equal to the distance $\Delta x$. Each beam emitter may be oriented parallel to the x-z plane and configured to emit a beam along the z axis. A first projection angle of each first linear stack in the y-z plane may be approximately equal to $\arctan(\Delta y/\Delta z)$. A second projection angle of each first linear stack in the x-y plane may be approximately equal to $\arctan(\Delta y/\Delta x)$. A third projection angle of each first linear stack in the x-z plane may be approximately equal to 45°. A beam size of the beam stack in a stacking direction may be approximately equal to $\Delta y \times N + b$, N being equal to a number of the beam emitters and b being equal to a size of each beam in the stacking direction. The stacking direction may be along a fast axis of the beams.

In yet another aspect, embodiments of the invention feature a wavelength-beam-combining (WBC) laser system that includes, consists essentially of, or consists of a plurality of beam-stacking modules, a dispersive element, and a partially reflective output coupler. Each beam-stacking module is configured to stack a plurality of emitted beams in at least one dimension and output a beam stack that includes, consists essentially of, or consists of the beams. The dispersive element is positioned to receive the plurality of beam stacks and combine the beam stacks into a combined beam. The output coupler is positioned to receive the combined beam, transmit a first portion of the combined beam as a WBC output beam, and reflect a second portion of the combined beam back toward the dispersive element and thence to beam emitters of the modules to stabilize emission wavelengths thereof.

Embodiments of the invention may include one or more of the following in any of a variety of combinations. For two or more of the beam-stacking modules, or even each beam-stacking module, (i) the beam-stacking module may include, consist essentially of, or consist of a plurality of beam emitters each configured to emit one of the beams, (ii) the beam emitters may be arranged in one or more first linear stacks, and/or (iii) optical paths of each of the beams, from its beam emitter to a shared exit point of the beam stack from the beam-stacking module, may be equal to each other. Two or more, or even each, beam-stacking module may include, consist essentially of, or consist of a plurality of interleaving mirrors arranged in one or more second linear stacks. For each beam-stacking module, (i) a number of the one or more second linear stacks may be equal to a number of the one or more first linear stacks, and/or (ii) each interleaving mirror may be positioned to receive a beam emitted by a different one of the beam emitters and direct the beam to the shared exit point. A plurality of first lenses may be disposed optically upstream of the dispersive element. Each first lens may be configured to receive a beam stack from one of the beam-stacking modules and converge chief rays of the beam stack toward the dispersive element. The laser system may include, disposed optically upstream of the dispersive element, a second lens configured to receive all of the beam stacks and collimate rays thereof. The laser system may include an optical telescope disposed optically downstream of the dispersive element and optically upstream of the output coupler. The dispersive element may include, consist essentially of, or consist of a reflective diffraction grating or a transmissive diffraction grating. The dispersive element may include, consist essentially of, or consist of a diffraction grating and one or more prisms. The beam-stacking modules may be mechanically positioned to converge the beam stacks toward the dispersive element. Two or more, or even each, of the beam stacks may be stacked along a fast axis of the beams thereof.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the term "substantially" means ±10%, and in some embodiments, ±5%. The term "consists essentially of" means excluding other materials that contribute to function, unless otherwise defined herein. Nonetheless, such other materials may be present, collectively or individually, in trace amounts. Herein, the terms "radiation" and "light" are utilized interchangeably unless otherwise indicated. Herein, "downstream" or "optically downstream," is utilized to indicate the relative placement of a second element that a light beam strikes after encountering a first element, the first element being "upstream," or "optically upstream" of the second element. Herein, "optical distance" between two components is the distance between two components that is actually traveled by light beams; the optical distance may be, but is not necessarily, equal to the physical distance between two components due to, e.g., reflections from mirrors or other changes in propagation direction experienced by the light traveling from one of the components to the other. Distances utilized herein may be considered to be "optical distances" unless otherwise specified.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 4A and 4B are, respectively, a three-dimensional model and a schematic top view of a laser system having three three-dimensional linear arrangements of laser emitters for beam stacking in accordance with various embodiments of the present invention;

DETAILED DESCRIPTION

Figure 1A:
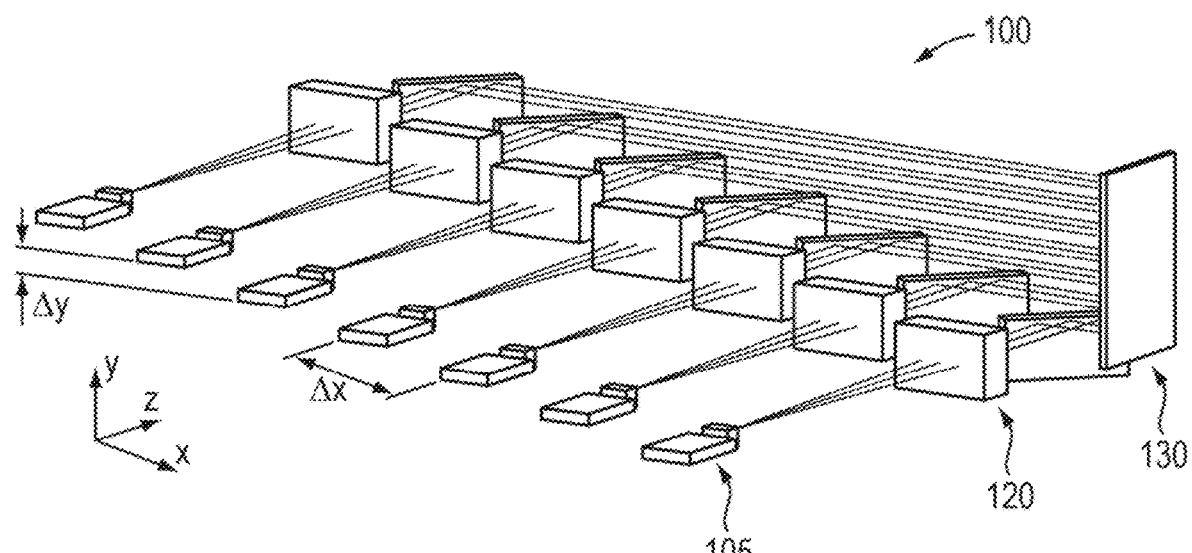
FIGS. 1A and 1B are, respectively, a three-dimensional model and a schematic top view of a conventional arrangement of laser emitters for beam stacking.
Figure 1B:
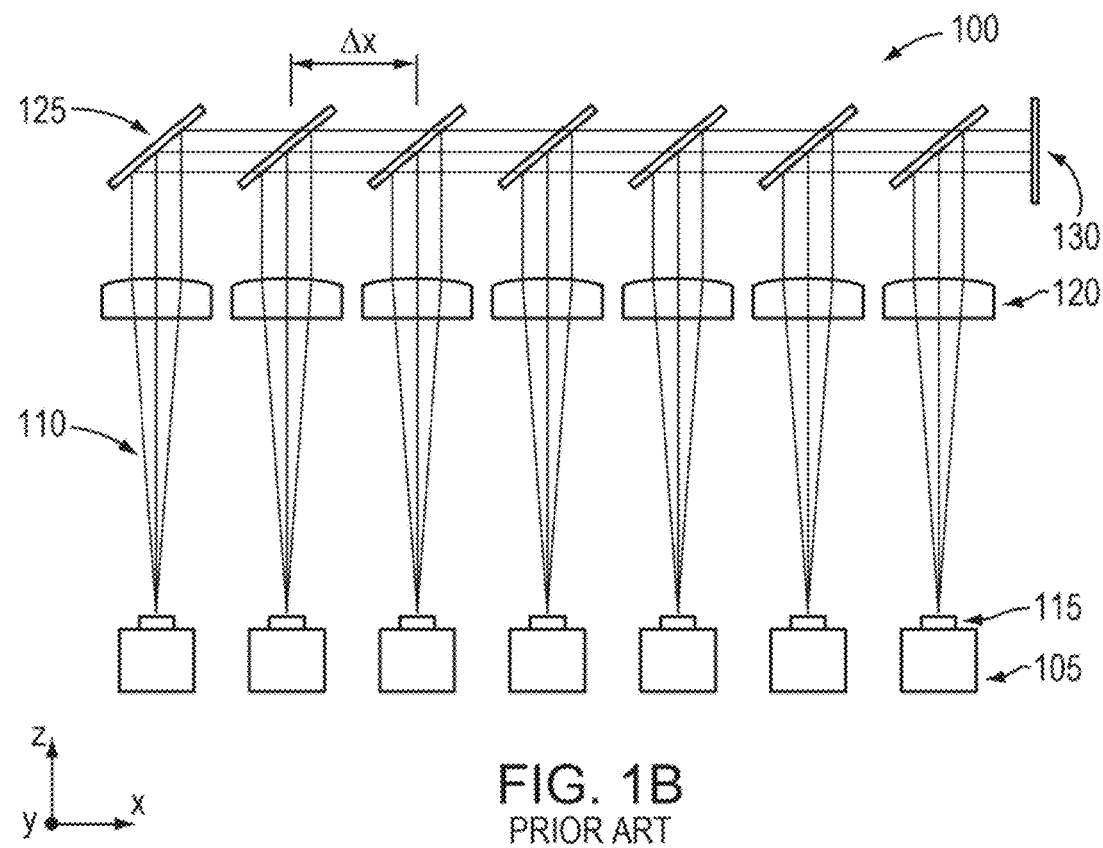

FIGS. 1A and 1B depict, as a three-dimensional model (FIG. 1A) and a schematic top view (FIG. 1B), a conventional arrangement 100 of seven single emitters 105 for linear vertical stacking along the fast axis of the emitted beams 110. FIGS. 1A and 1B show three "rays" being emitted from each of the emitters; however, these rays constitute a single beam from the single emitter, where the center ray represents the chief ray of the beam while the peripheral rays represent the approximate geometric spread of the beam. As shown, the individual beams 110 are first collimated, in the fast axis, by FAC lenses 115 that are each associated with one of the emitters. Each of the beams is then collimated, in the slow axis, by SAC lenses 120 that are each associated with one of the emitters. The collimated beams are then reflected by a set of interleaving mirrors 125 to a virtual common surface 130, thereby forming the vertical stack of beams. As may be observed in the figures, the stacked beams appear to fully overlap in the top view of FIG. 1B (i.e., in the slow axis), and FIG. 1A shows the spatial separation of the stacked beams in the vertical dimension (i.e., in the fast axis).

As is evident in FIGS. 1A and 1B, the conventional linear stacking arrangement is relatively bulky. In order to stack the beams without obstruction, the arrangement 100 of FIGS. 1A and 1B requires not only a vertical offset $\Delta y$ between the emitters 105, but also a horizontal offset $\Delta x$. In this case, the minimum horizontal offset $\Delta x$ between two adjacent emitters 105 is the width of an individual SAC lens 120 (and/or the width of the sub-mount for each emitter 105). As also shown, the horizontal offsets $\Delta x$ result in different optical path lengths traversed by each of the beams 110 between their emitter 105 and the virtual surface 130. This optical path length difference will degrade the overall beam quality measured at or optically downstream of the surface 130, reduce fiber-coupling efficiency of the stacked beams, and increase the fiber-coupling numerical aperture (NA) of the stacked beams. The optical path difference also renders the stacking arrangement 100 of FIGS. 1A and 1B unsuitable for various applications and systems, including WBC techniques and systems, which require substantially equal optical paths for individual emitters in order to assure stable and efficient WBC and to produce the highest beam quality of the combined beams. In addition, the conventional arrangement 100 of FIGS. 1A and 1B requires separate SAC lenses 120 for each individual emitter 105, which complicates the arrangement and packaging thereof, and which also increases the total system cost.

Figure 2A:
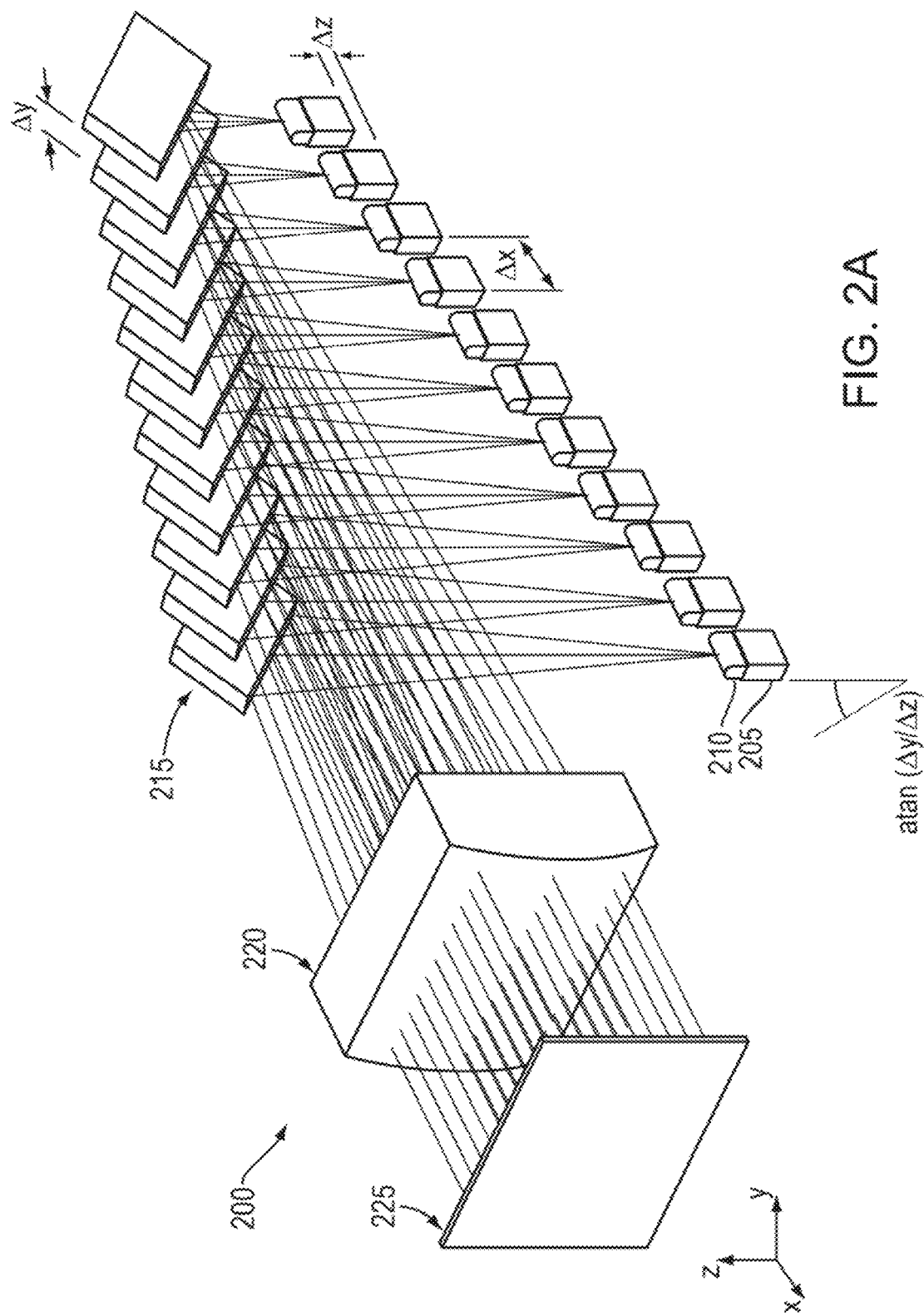
FIGS. 2A-2C are, respectively, a three-dimensional model, a schematic top view, and a schematic side view of a three-dimensional linear arrangement of laser emitters for beam stacking in accordance with various embodiments of the present invention.
Figure 2B:
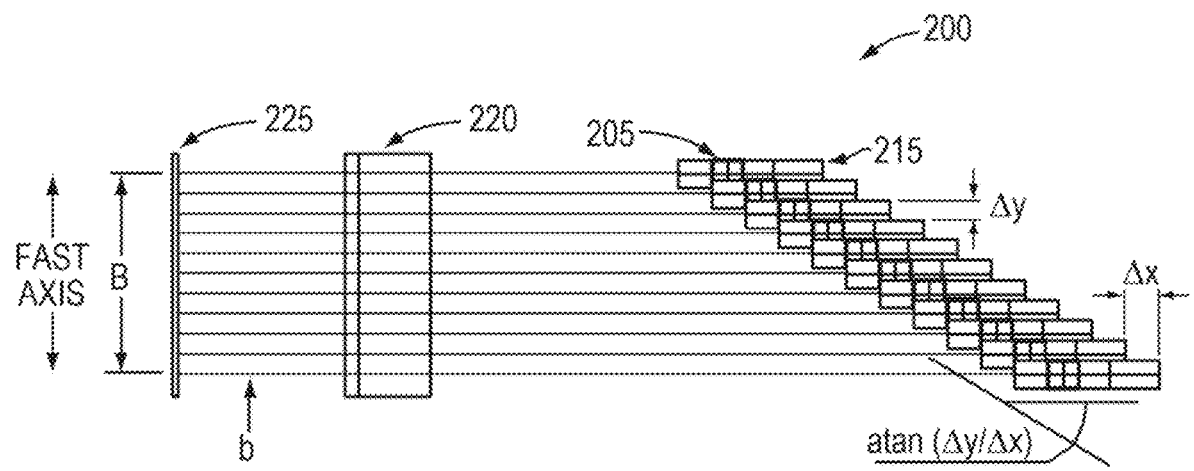
Figure 2C:
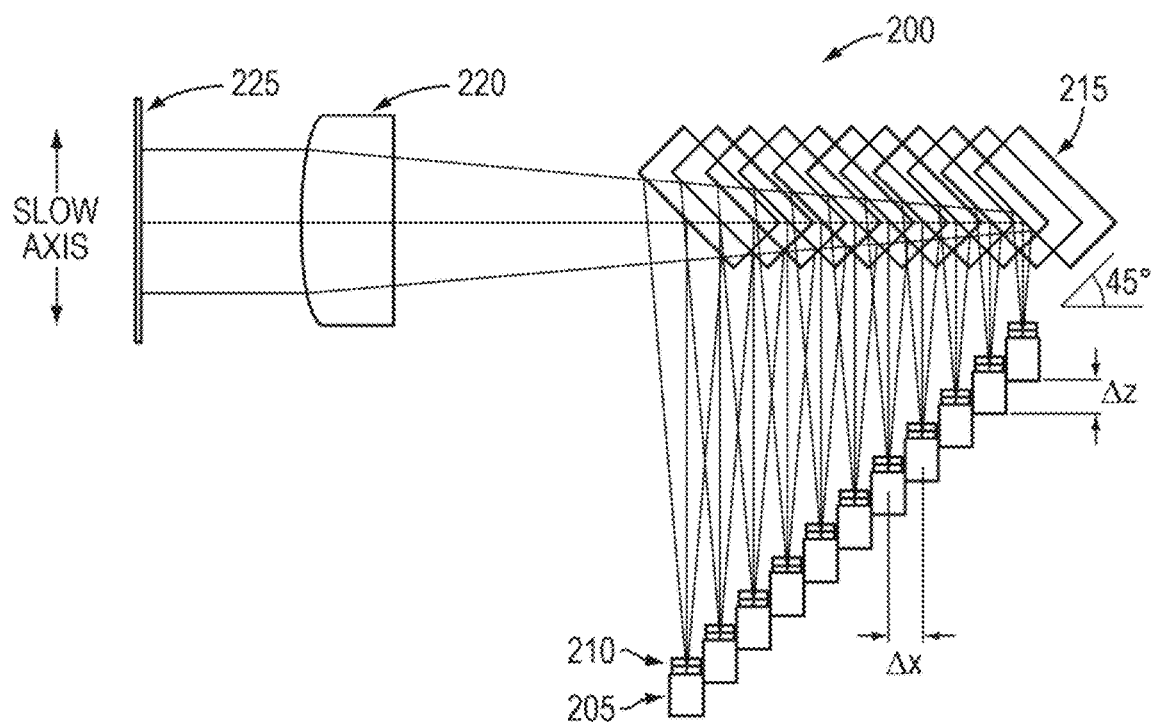
Figure 2D:
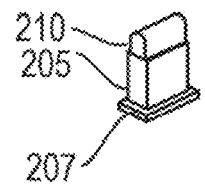
FIG. 2D depicts an embodiment of an emitter 205 on a submount 207 associated with a fast-axis collimation lens 210.

FIGS. 2A-2C depict, as a three-dimensional model (FIG. 2A), a schematic top view in the x-y plane (FIG. 2B), and a schematic side view in the x-z plane (FIG. 2C), a three-dimensional linear arrangement 200 of 11 single emitters 205 for beam stacking along the fast axis in accordance with embodiments of the present invention. As shown, each emitter 205 is associated with a fast-axis collimation (FAC) lens 210, which collimates the beam emitted by the emitter 205 in the fast axis. Downstream of the FAC lenses 210, the collimated beams propagate to, and are reflected by, a set of interleaving mirrors 215, one associated with each of the emitters 205. The beams are reflected to a shared slow-axis collimation (SAC) lens 220, which collimates all of the beams in the slow axis, and then the beams are shown as propagating to a shared virtual common surface 225 downstream of the SAC lens 220.

As shown, in accordance with embodiments of the present invention, the emitters 205 are linearly arranged with offsets along all of the x, y, and z axes (designated as $\Delta x$, $\Delta y$, and $\Delta z$). Moreover, the interleaving mirrors 215 are also linearly arranged with the same offsets as the emitters 205 along the x and y axes ($\Delta x$, $\Delta y$), respectively. As mentioned above, one advantage of embodiments of the invention is the matching optical path length for all of the beams, between the emitter 205 of the beam and the SAC lens 220 (or, equivalently, between the emitter 205 of the beam and the virtual common surface 225). In accordance with various embodiments, the emitter offset along the z axis ($\Delta z$) compensates the beam path difference caused by the offset between emitters along the x axis ($\Delta x$). That is, $\Delta z = \Delta x$. In various embodiments, the minimum value of $\Delta z$ or $\Delta x$ may be determined by the width of emitter sub-mount utilized to support each emitter 205.

As also shown, the individual laser beams (or sub-beams) are effectively stacked along the fast axis downstream of the interleaving mirrors 215 with an interval of $\Delta y$. The overall beam size (B, indicated in FIG. 2B) in the stacking direction may be estimated as $B = \Delta y \times N + b$, where N is the number of beams in the stacking direction and b is the collimated beam size of a beam along the fast axis. Note that, at least in the depicted embodiment, the fast axis and the stacking direction are in the same dimension, both along y axis.

Since in various embodiments, as noted above, $\Delta z = \Delta x$, the emitters 205 appear to be linearly aligned along a 45° line in the side view of FIG. 2C. Similarly, when viewed from above (FIG. 2B), the emitters 205 are linearly aligned along a line having an angle equal to $\arctan(\Delta y/\Delta x)$. In various embodiments, this angle is likely smaller than 45° because typically (although not necessarily) $\Delta y < \Delta x$. Similarly, on the y-z plane (not shown), the emitters 205 would be linearly aligned along a line having an angle equal to $\arctan(\Delta y/\Delta z)$, which is equal to $\arctan(\Delta y/\Delta x)$. Thus, if each emitter 205 is oriented on the x-z plane and emits along the z axis, then all of the emitters 205 are linearly aligned along a compound angle with projection angles of $\arctan(\Delta y/\Delta z)$, $\arctan(\Delta y/\Delta x)$, and 45° on the y-z, x-y, and x-z planes, respectively.

More generally, in embodiments of the present invention, the beam emitters are arranged in one or more straight lines in three-dimensional space that are not parallel to or perpendicular to the axis along which the beam emitters emit their beams. For example, as shown in the exemplary arrangement 200 of FIGS. 2A-2C, the emitters 205 emit their beams along the z axis, while the linear arrangement of emitters defines a line that is neither parallel nor perpendicular to the z axis. In various embodiments, the one or more straight lines of emitters 205 is not parallel to or perpendicular to the stacking dimension of the beams (e.g., the slow axis).

Offsetting of all of the emitters 205 along all of the x, y, and z axes, plus the corresponding arrangement of interleaving mirrors 215, results in effective optical stacking in fast axis and equal optical path lengths from each emitter 205 to the virtual common surface 225. In such embodiments, all of the beams may share the single SAC lens 220, thereby enabling very compact single-emitter stacking. While FIGS. 2A-2C depict a stacking arrangement of 11 emitters 205, embodiments of the invention may feature fewer or more than 11 emitters 205.

Figure 3A:
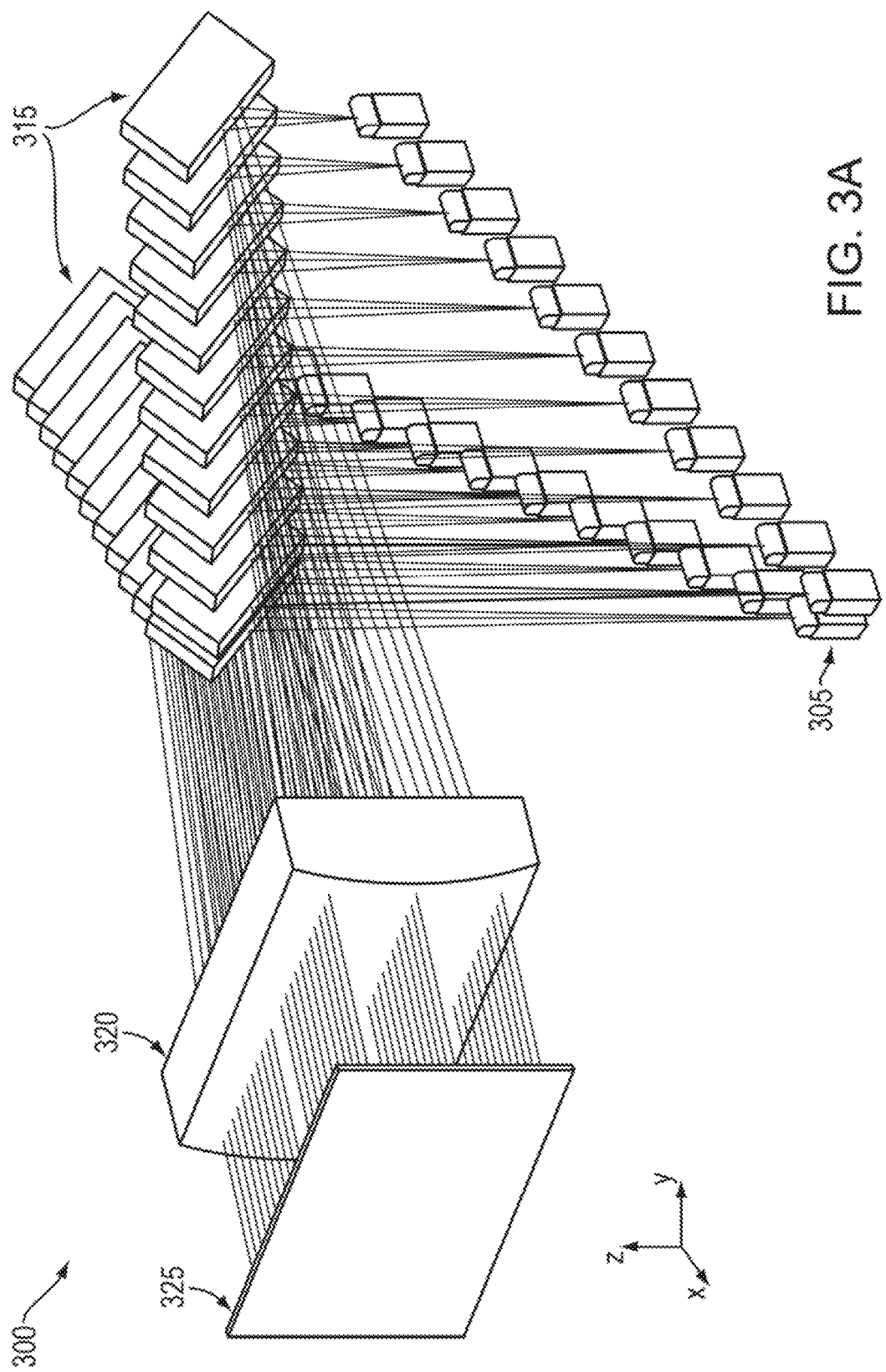
FIGS. 3A-3C are, respectively, a three-dimensional model, a schematic top view, and a schematic side view of an exemplary laser system having two three-dimensional linear arrangements of laser emitters for beam stacking in accordance with various embodiments of the present invention.
Figure 3B:
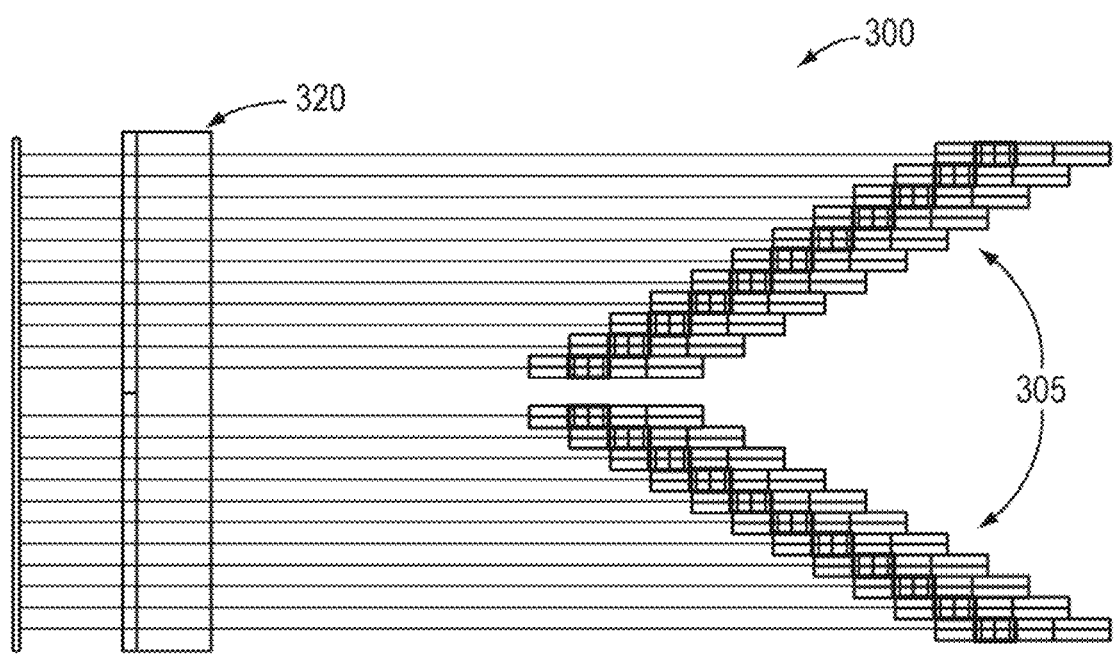
Figure 3C:
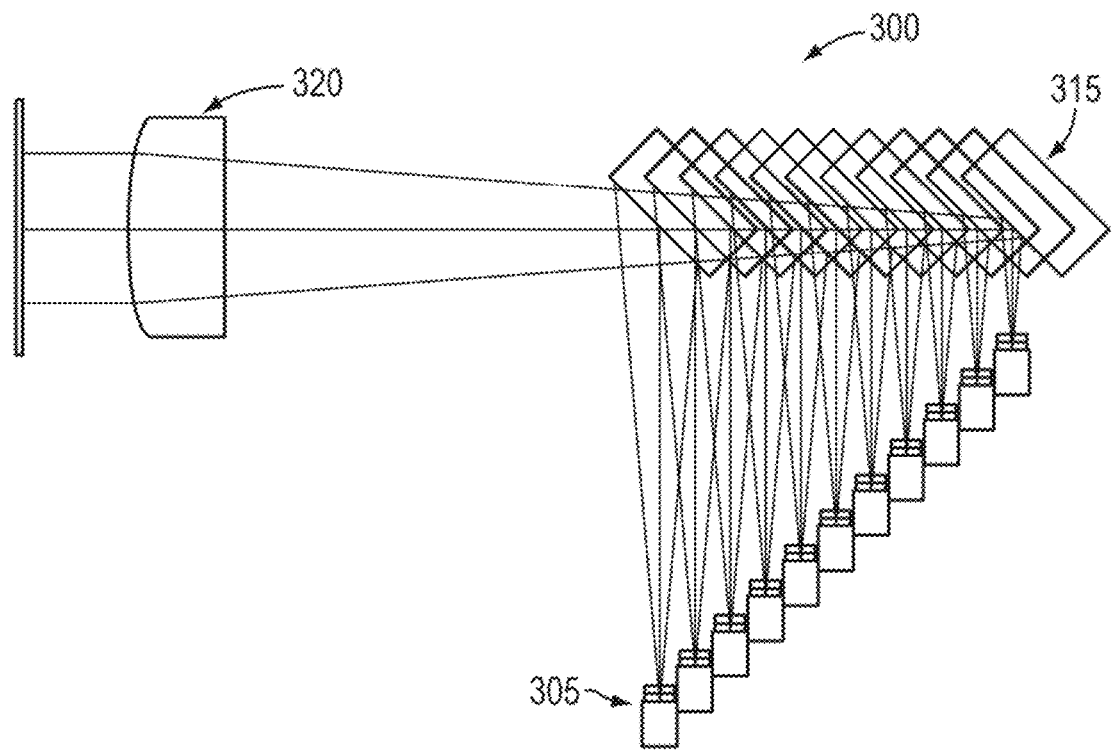

FIGS. 3A-3C depict, as a three-dimensional model (FIG. 3A), a schematic top view in the x-y plane (FIG. 3B), and a schematic side view in the x-z plane (FIG. 3C), a laser system 300 having two three-dimensional linear arrangements of 11 single emitters 305 for beam stacking along the fast axis in accordance with embodiments of the present invention. As in the embodiment of FIGS. 2A-2C, each of the 22 emitters 305 is associated with a FAC lens, and the beams emitted by the emitters 305 propagate to, and are reflected by, a set of interleaving mirrors 315, one associated with each of the emitters 305. The beams are reflected to a shared SAC lens 320, which collimates all of the beams in the slow axis. The optical path lengths between each of the emitters 305 and the SAC lens 320 (or, equivalently, between each of the emitters 305 and shared virtual common surface 325 downstream of the SAC lens 320) are the same, as in the embodiment depicted in FIGS. 2A-2C. In the embodiment 300 of FIGS. 3A-3C, the two linear emitter arrangements are aligned as mirror images of each other. Thus, the side view of FIG. 3C looks basically identical to the side view depicted in FIG. 2C, while the top view of FIG. 3B shows the 22 emitters 305 as arranged in multiple lines. While the depicted embodiment features two linear stacks of emitters, laser systems and modules in accordance with embodiments of the present invention may include more than two linear stacks of single emitters, with every two adjacent linear stacks aligned as mirror images of each other; the linear emitter arrangements of such modules may appear to "zig zag" when viewed from above. While the depicted embodiment features the same number of emitters in each linear stack, in various embodiments, two or more linear stacks may feature different numbers of emitters (and thus, different numbers of interleaving mirrors associated therewith).

Laser systems and modules in accordance with embodiments of the present invention may also feature multiple linear arrangements of single emitters arranged in parallel, rather than as mirror images of each other as in FIGS. 3A-3C. FIGS. 4A and 4B depict, as a three-dimensional model (FIG. 4A), and a schematic top view in the x-y plane (FIG. 4B), a laser system 400 having three three-dimensional linear arrangements of 7 single emitters 405 for beam stacking along the fast axis in accordance with embodiments of the present invention. More generally, embodiments of the invention may feature multiple (M) single-emitter linear stacks with each stack having N emitters. As mentioned above, FIGS. 4A and 4B depict an exemplary embodiment in which M=3 and N=7. In such embodiments, the module or system has M×N emitters 405 and M×N interleaving mirrors 415, and all of the beams propagate to a single shared SAC lens 420 (and thence to a virtual common surface 425); thus, the optical path lengths of all of the beams are equal to each other, as in the embodiments detailed above. As observed more easily in FIG. 4B, from above the linear stacks of emitters 405 are parallel to each other. While the depicted embodiment features the same number of emitters 405 in each linear stack, in various embodiments, two or more linear stacks may feature different numbers of emitters (and thus, different numbers of interleaving mirrors associated therewith); that is, N may be different for two or more of the linear stacks.

Figure 5A:
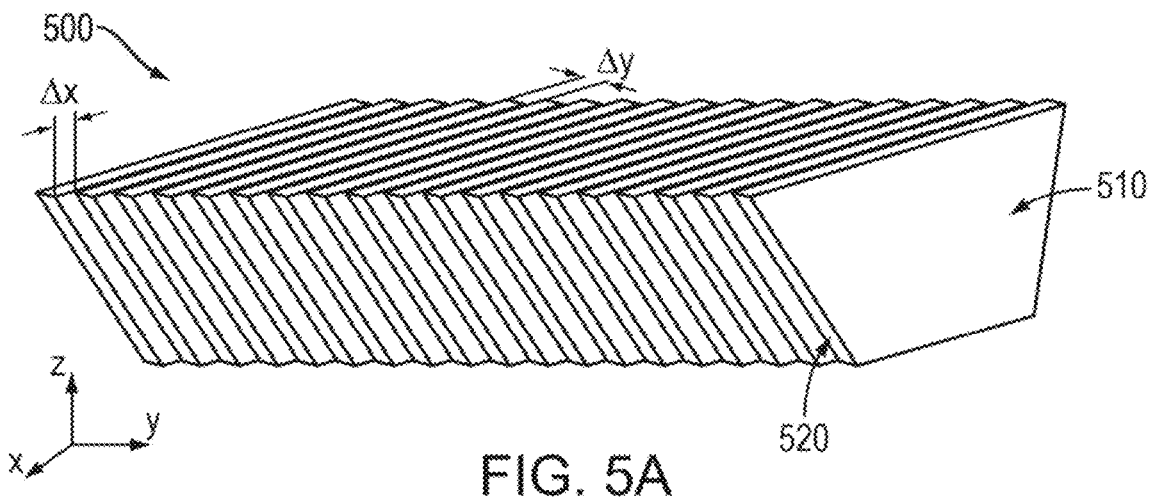
FIGS. 5A-5C are, respectively, a three-dimensional model, a schematic top view, and a schematic side view of a stack of interleaving mirrors for use with a linear stack of emitters in accordance with various embodiments of the present invention.
Figure 5B:
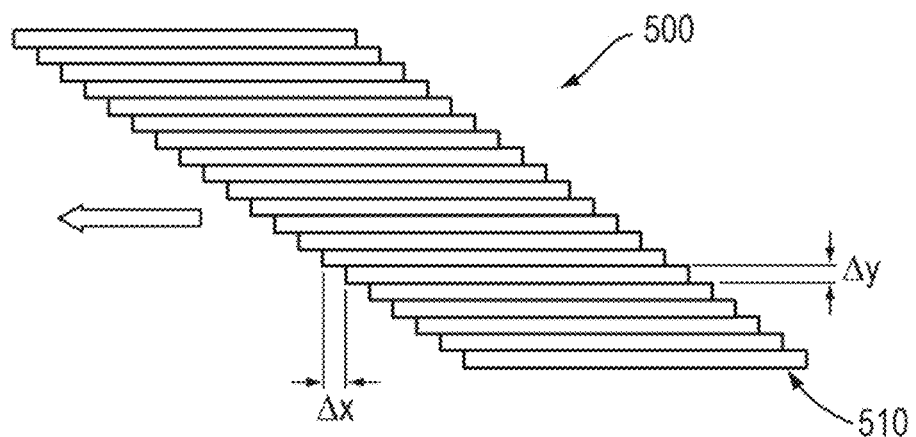
Figure 5C:
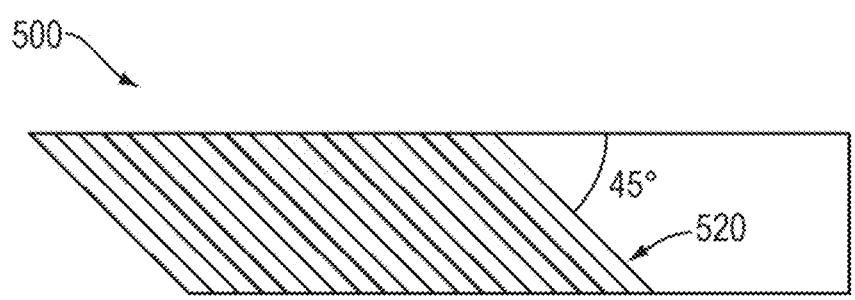
Figure 5D:
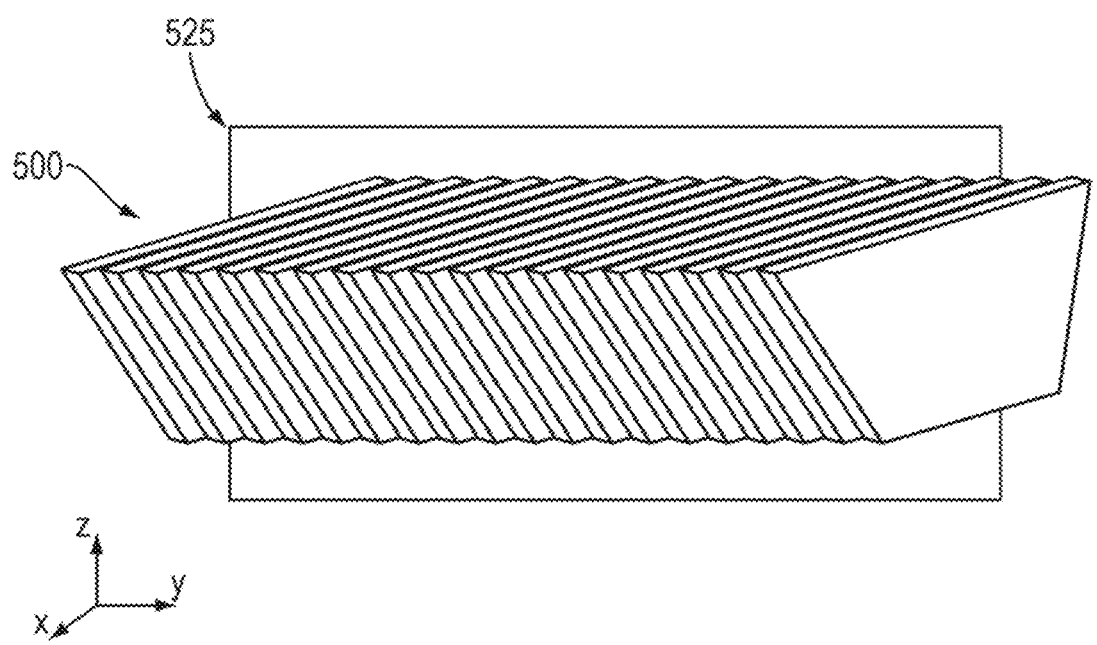
FIG. 5D depicts a stack of common mirrors 500 mounted to a common platform 525.

FIGS. 5A-5C depict, as a three-dimensional model (FIG. 5A), a schematic top view in the x-y plane (FIG. 5B), and a schematic side view in the x-z plane (FIG. 5C), a stack 500 of N interleaving mirrors 510 for use with a linear stack of N emitters in accordance with embodiments of the present invention. As shown, the interleaving mirrors 510 are aligned with exemplary offset ($4x$) and interval ($\Delta y$) for utilization with the linear stack of N single emitters. As shown, in accordance with embodiments of the invention, the mirror surfaces 520 of the interleaving mirrors are arranged at angles of 45° so that the laser beams from the corresponding emitters will be reflected at angles of 90°. In various embodiments, mirror angles of 45° are utilized because the use of interleaving mirrors arranged at other angles is practically inconvenient. In various other embodiments, different mirror angles may be utilized.

In accordance with embodiments of the invention, the mirror stack 500 may be assembled as a single unitary part or piece, for example bonded via optical contact or via an adhesive (e.g., epoxy), or fixed in place with proper fixtures. Individual mirrors 510 may be pre-aligned with off-line laser beam(s) and/or proper jigs and fixtures.

In various embodiments, the mirror stack 500 may be a monolithic component made via, e.g., molding or 3-D printing. Such components may have N narrow mirror surfaces 520 with the desired offset ($\Delta x$) and interval ($\Delta y$) between the surfaces 520. As a monolithic component, the mirror stack 500 may have a straight-cut back surface, chamfered side edges, and/or any other shapes. The N narrow mirror surfaces 520 may be machined (via, e.g., etching or laser processing) on a single substrate, such as a substrate including, consisting essentially of, or consisting of glass, ceramic, and/or a reflective metal such as copper and/or aluminum. In various embodiments, the mirror surfaces 520 are polished and/or coated (e.g., with a metal coating) for high reflectivity.

Figure 6:
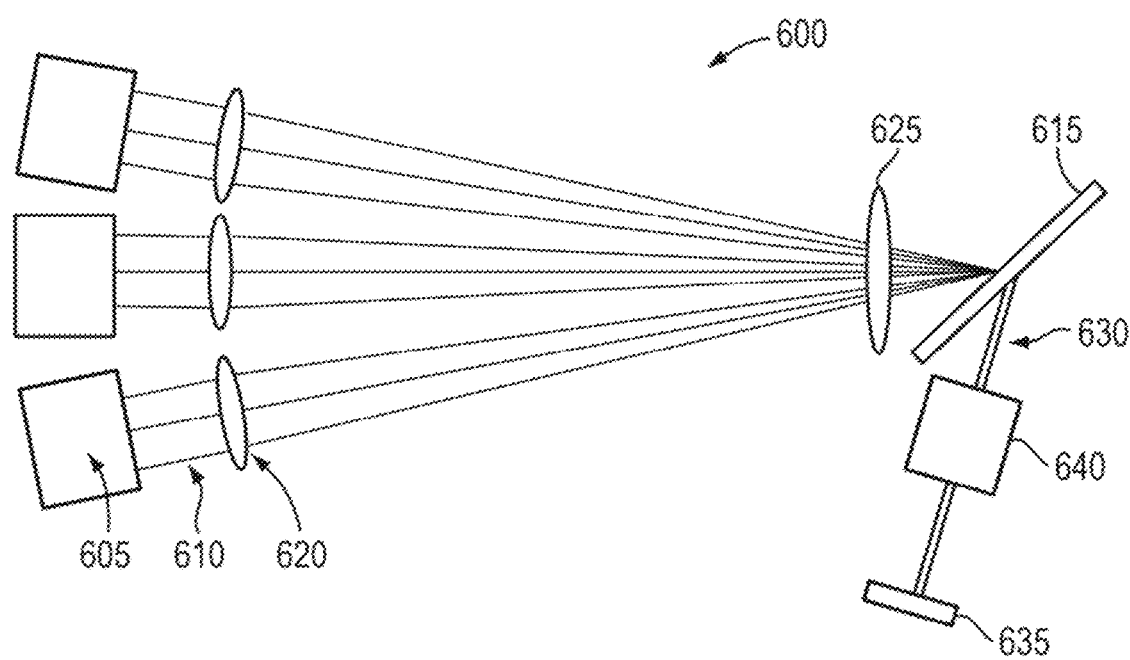
FIG. 6 is a schematic diagram of a laser system that combines sets of stacked beams from multiple input linear arrangements of laser emitters in accordance with various embodiments of the invention.

Once the three-dimensional linear emitter arrangements in accordance with embodiments of the invention are utilized to stack beams in one dimension, the stacked beams may be utilized as an input for a more complex laser system such as a WBC laser system, or may be directly coupled into one or more optical fibers (i.e., utilized for direct fiber coupling). FIG. 6 schematically depicts one such WBC system 600 that combines sets of stacked beams from three different linear input arrangements, or "modules," in accordance with embodiments of the invention. FIG. 6 depicts the WBC system 600 in the WBC, or beam-combining, dimension. Each of the modules 605 in the system 600 of FIG. 6 may include any of the linear emitter arrangements detailed above. The lines 610 represent the chief rays of the beams from the individual beam stacks emitted by each module 605. While only three lines 610 are shown for each module 605 for clarity, each module 605 may form beam stacks utilizing more than three individual emitters, in various embodiments of the invention.

As shown in FIG. 6, the modules 605 may be individually angled such that the beam stacks emitted thereby (and therefore their exit points and SAC lenses, if present) converge toward a dispersive element 615 (which may include, consist essentially of, or consist of, e.g., a diffraction grating). As also shown, a lens 620 may be associated with each module 605 to converge the chief rays emitted thereby to the dispersive element 615. In addition, a shared lens 625 may collimate the individual beams of the beam stacks from all of the modules before the beam stacks are incident on the dispersive element 615.

At the dispersive element 615, the beams from the modules 605 are combined into a single beam 630, which propagates to a partially reflective output coupler 635. At the coupler 635, a first portion of the beam 630 is output from the system as the WBC output beam, while a reflected second portion of the beam 630 propagates back to the individual emitters in the modules 605 for feedback and wavelength locking (i.e., to stabilize the emission wavelengths of the emitters). One or more optional optical systems 640 may be disposed optically downstream of the dispersive element 615 and/or the output coupler 635, for one or more purposes such as beam shaping, imaging, beam redirection or repositioning, and/or cross-coupling mitigation. For example, optical system 640 may include, consist essentially of, or consist of an optical telescope for mitigation of optical cross-talk, as disclosed in U.S. Pat. No. 9,256,073, filed on Mar. 15, 2013, and U.S. Pat. No. 9,268,142, filed on Jun. 23, 2015, the entire disclosures of which are hereby incorporated by reference herein.

In the WBC laser system 600 of FIG. 6, each module 605 may be considered to be conceptually similar to a diode bar utilized in conventional WBC systems. However, the WBC system 600 of FIG. 6 utilizes optically stacked single emitters rather than packaged multiple-emitters such as diode bars. This provides several advantages. For example, since the beams are stacked in the fast axis direction, there is no need for the use of optical rotators or twisters, simplifying the system and preventing complications such as clipping loss and optical aberration. In addition, in the modules 605 there is no emitter smile, which can substantially reduce WBC beam quality and impact wavelength locking. In addition, the system 600 of FIG. 6 may be operated at significantly lower operating currents, because the single emitters of the modules 605 may be easily electrically connected in series. In addition, since the single emitters are spaced apart from each other, there is less or no thermal crosstalk between individual emitters, and therefore cooling systems (e.g., which may utilize flowing coolant fluid) utilized for the system 600 of FIG. 6 may be much less complex or omitted entirely.

In various embodiments of the present invention, the output beams of laser systems including one or more linear emitter arrangements (e.g., laser system 600) may be propagated, e.g., via a fiber optic module, to a delivery optical fiber (which may be coupled to a laser delivery head) and/or utilized to process a workpiece. For example, the output beam from laser system depicted in FIG. 6 may be coupled into a delivery fiber, or the output beam may be combined with the output beams of one or more other laser systems (via, e.g., polarization beam combining, spatial beam combining, etc.), and the combined beam may be coupled into a delivery fiber for processing of a workpiece.

In various embodiments, a laser head contains one or more optical elements utilized to focus the output beam onto a workpiece for processing thereof. For example, laser heads in accordance with embodiments of the invention may include one or more collimators (i.e., collimating lenses) and/or focusing optics (e.g., one or more focusing lenses). A laser head may not include a collimator if the beam(s) entering the laser head are already collimated. Laser heads in accordance with various embodiments may also include one or more protective window, a focus-adjustment mechanism (manual or automatic, e.g., one or more dials and/or switches and/or selection buttons). Laser heads may also include one or more monitoring systems for, e.g., laser power, target material temperature and/or reflectivity, plasma spectrum, etc. A laser head may also include optical elements for beam shaping and/or adjustment of beam quality (e.g., variable BPP) and may also include control systems for polarization of the beam and/or the trajectory of the focusing spot. In various embodiments, the laser head may include one or more optical elements (e.g., lenses) and a lens manipulation system for selection and/or positioning thereof for, e.g., alteration of beam shape and/or BPP of the output beam, as detailed in U.S. patent application Ser. No. 15/188,076, filed on Jun. 21, 2016, the entire disclosure of which is incorporated by reference herein. Exemplary processes include cutting, piercing, welding, brazing, annealing, etc. The output beam may be translated relative to the workpiece (e.g., via translation of the beam and/or the workpiece) to traverse a processing path on or across at least a portion of the workpiece.

In embodiments utilizing an optical delivery fiber, the optical fiber may have many different internal configurations and geometries. For example, the optical fiber may include, consist essentially of, or consist of a central core region and an annular core region separated by an inner cladding layer. One or more outer cladding layers may be disposed around the annular core region. Embodiments of the invention may incorporate optical fibers having configurations described in U.S. patent application Ser. No. 15/479,745, filed on Apr. 5, 2017, U.S. patent application Ser. No. 15/879,500, filed on Jan. 25, 2018, and U.S. patent application Ser. No. 16/675,655, filed on Nov. 6, 2019, the entire disclosure of each of which is incorporated by reference herein.

In various embodiments, a controller may control the motion of the laser head or output beam relative to the workpiece via control of, e.g., one or more actuators. The controller may be present in laser systems featuring helical emitter arrangements as disclosed herein. The controller may also operate a conventional positioning system configured to cause relative movement between the output laser beam and the workpiece being processed. For example, the positioning system may be any controllable optical, mechanical or opto-mechanical system for directing the beam through a processing path along a two- or three-dimensional workpiece. During processing, the controller may operate the positioning system and the laser system so that the laser beam traverses a processing path along the workpiece. The processing path may be provided by a user and stored in an onboard or remote memory, which may also store parameters relating to the type of processing (cutting, welding, etc.) and the beam parameters necessary to carry out that processing. The stored values may include, for example, beam wavelengths, beam shapes, beam polarizations, etc., suitable for various processes of the material (e.g., piercing, cutting, welding, etc.), the type of processing, and/or the geometry of the processing path.

As is well understood in the plotting and scanning art, the requisite relative motion between the output beam and the workpiece may be produced by optical deflection of the beam using a movable mirror, physical movement of the laser using a gantry, lead-screw or other arrangement, and/or a mechanical arrangement for moving the workpiece rather than (or in addition to) the beam. The controller may, in some embodiments, receive feedback regarding the position and/or processing efficacy of the beam relative to the workpiece from a feedback unit, which will be connected to suitable monitoring sensors.

The controller may be provided as either software, hardware, or some combination thereof. For example, the system may be implemented on one or more conventional server-class computers, such as a PC having a CPU board containing one or more processors such as the Pentium or Celeron family of processors manufactured by Intel Corporation of Santa Clara, Calif., the 680x0 and POWER PC family of processors manufactured by Motorola Corporation of Schaumburg, Ill., and/or the ATHLON line of processors manufactured by Advanced Micro Devices, Inc., of Sunnyvale, Calif. The processor may also include a main memory unit for storing programs and/or data relating to the methods described herein. The memory may include random access memory (RAM), read only memory (ROM), and/or FLASH memory residing on commonly available hardware such as one or more application specific integrated circuits (ASIC), field programmable gate arrays (FPGA), electrically erasable programmable read-only memories (EEPROM), programmable read-only memories (PROM), programmable logic devices (PLD), or read-only memory devices (ROM). In some embodiments, the programs may be provided using external RAM and/or ROM such as optical disks, magnetic disks, as well as other commonly used storage devices. For embodiments in which the functions are provided as one or more software programs, the programs may be written in any of a number of high level languages such as FORTRAN, PASCAL, JAVA, C, C++, C#, BASIC, various scripting languages, and/or HTML. Additionally, the software may be implemented in an assembly language directed to the microprocessor resident on a target computer; for example, the software may be implemented in Intel 80x86 assembly language if it is configured to run on an IBM PC or PC clone. The software may be embodied on an article of manufacture including, but not limited to, a floppy disk, a jump drive, a hard disk, an optical disk, a magnetic tape, a PROM, an EPROM, EEPROM, field-programmable gate array, or CD-ROM.

In addition, the laser system may incorporate one or more systems for detecting the thickness of the workpiece and/or heights of features thereon. For example, the laser system may incorporate systems (or components thereof) for interferometric depth measurement of the workpiece, as detailed in U.S. patent application Ser. No. 14/676,070, filed on Apr. 1, 2015, the entire disclosure of which is incorporated by reference herein. Such depth or thickness information may be utilized by the controller to control the output beam to optimize the processing (e.g., cutting, piercing, or welding) of the workpiece, e.g., in accordance with records in the database corresponding to the type of material being processed.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

The invention claimed is:

1. A laser apparatus in a three-dimensional space having x, y, and z mutually perpendicular axes defining x-y, x-z, and y-z planes, the laser apparatus comprising:
  a plurality of beam emitters arranged in one or more first linear stacks, wherein in each first linear stack the beam emitters are separated from each other (i) along the x axis by a distance $\Delta x$, (ii) along the y axis by a distance $\Delta y$, and (iii) along the z axis by a distance $\Delta z$; and
  a plurality of interleaving mirrors arranged in one or more second linear stacks, wherein (i) a number of the one or more second linear stacks is equal to a number of the one or more first linear stacks, and (ii) each interleaving mirror is positioned to receive a beam emitted by a different one of the beam emitters and direct the beam to a shared exit point, whereby a beam stack is output at the shared exit point,
  wherein optical distances traversed by each beam from its emitter to the shared exit point are all equal to each other, and
  wherein a beam size of the beam stack in a stacking direction is substantially equal to $\Delta y \times N + b$, N being equal to a number of the beam emitters and b being equal to a size of each beam in the stacking direction.

2. The laser apparatus of claim 1, wherein each beam emitter is configured to emit only a single beam.

3. The laser apparatus of claim 1, wherein in each second linear stack the interleaving mirrors are separated from each other (i) along the x axis by the distance $\Delta x$, and (ii) along the y axis by the distance $\Delta y$.

4. The laser apparatus of claim 1, further comprising a collimation lens disposed at the shared exit point.

5. The laser apparatus of claim 4, wherein the collimation lens is a slow-axis collimation lens configured to receive, and collimate in a slow axis, the beam stack.

6. The laser apparatus of claim 1, wherein each beam emitter comprises a diode emitter.

7. The laser apparatus of claim 1, further comprising a plurality of fast-axis collimation (FAC) lenses, each FAC lens being positioned to receive the beam from a different beam emitter and collimate the beam in a fast axis.

8. The laser apparatus of claim 1, wherein the one or more first linear stacks consists of a single first linear stack.

9. The laser apparatus of claim 1, wherein the one or more first linear stacks comprises a plurality of first linear stacks.

10. The laser apparatus of claim 9, wherein the plurality of first linear stacks are arranged parallel to each other.

11. The laser apparatus of claim 9, wherein the plurality of first linear stacks are arranged as pairwise mirror images.

12. The laser apparatus of claim 1, wherein $\Delta z$ is substantially equal to $\Delta x$.

13. The laser apparatus of claim 1, wherein:
each beam emitter is disposed on a different sub-mount; and
$\Delta x$ is greater than or substantially equal to a width of a single sub-mount.

14. The laser apparatus of claim 13, wherein $\Delta z$ is greater than or substantially equal to the width of a single sub-mount.

15. The laser apparatus of claim 1, wherein, in the beam stack, the beams emitted by the beam emitters are stacked along a fast axis of the beams.

16. The laser apparatus of claim 1, wherein:
each beam emitter is oriented parallel to the x-z plane and configured to emit a beam along the z axis;
a first projection angle of each first linear stack in the y-z plane is substantially equal to $\arctan(\Delta y/\Delta z)$;
a second projection angle of each first linear stack in the x-y plane is substantially equal to $\arctan(\Delta y/\Delta x)$; and
a third projection angle of each first linear stack in the x-z plane is substantially equal to 45°.

17. The laser apparatus of claim 1, wherein the stacking direction is along a fast axis of the beams.

18. The laser apparatus of claim 1, wherein each second linear stack is a monolithic component comprising a plurality of mirror surfaces.

19. The laser apparatus of claim 1, wherein each second linear stack comprises a plurality of interleaving mirrors affixed to a common platform.

* * * * *